(12) United States Patent
Qi et al.

(10) Patent No.: US 6,512,690 B1
(45) Date of Patent: Jan. 28, 2003

(54) HIGH SENSITIVITY COMMON SOURCE AMPLIFIER MRAM CELL, MEMORY ARRAY AND READ/WRITE SCHEME

(75) Inventors: Qiuqun (Kevin) Qi, Fremont, CA (US); Xizeng Shi, Fremont, CA (US)

(73) Assignee: Read-Rite Corporation, Fremont, CA (US)

( * ) Notice: Subject to any disclaimer, the term of this patent is extended or adjusted under 35 U.S.C. 154(b) by 0 days.

(21) Appl. No.: 09/990,425

(22) Filed: Nov. 21, 2001

Related U.S. Application Data
(60) Provisional application No. 60/312,579, filed on Aug. 15, 2001.

(51) Int. Cl.[7] ............................................... G11C 11/14
(52) U.S. Cl. ....................................... 365/171; 365/158
(58) Field of Search ................................ 365/171, 158, 365/174, 161

(56) References Cited

U.S. PATENT DOCUMENTS 6,275,411 B1 * 8/2001 Doughton et al. .......... 365/158
6,304,477 B1 * 10/2001 Naji ............................. 365/50
6,324,093 B1 * 11/2001 Perner et al. ............... 365/171

* cited by examiner

*Primary Examiner*—Vu A. Le
(74) *Attorney, Agent, or Firm*—Sawyer Law Group LLP

(57) ABSTRACT

In the present invention, a magnetic random access memory (MRAM) cell includes a magnetic tunnel junction (MTJ) and a transistor. This memory cell provides a boosted output signal between different MTJ states stored. A method that is used by MRAM array for providing larger output voltage signal is also disclosed. The memory may comprise a plurality of such cells which are wired to form XY array. The source of the transistor is coupled to one end of the magnetic tunneling junction, while the drain of the transistor is coupled with an output for reading the magnetic memory cell. Another end of the magnetic tunneling junction is grounded. During reading, a constant voltage is applied to the gate of the transistor in selected memory cell. The drain of the transistor is connected to supply voltage via a load. The transistor functions both as switching element and amplifier to boost the output signal between different MTJ states. Either voltage or current at output can be detected to determine MTJ state.

16 Claims, 5 Drawing Sheets

HIGH SENSITIVITY COMMON SOURCE AMPLIFIER MRAM CELL, MEMORY ARRAY AND READ/WRITE SCHEME

CROSS-REFERENCE TO RELATED APPLICATION

This application is claiming under 35 USC 119(e) the benefit of provisional patent Application Ser. No. 60/312,579 filed on Aug. 15, 2001.

FIELD OF THE INVENTION

The present invention relates to magnetic memory systems, and more particularly to a method and system for providing a magnetic memory cell and a read/write scheme for utilizing the magnetic memory cell.

BACKGROUND OF THE INVENTION

Magnetic memories are often used in storing data. One type of memory currently of interest utilizes magnetic tunneling junctions in the memory cells. A magnetic tunneling junction typically includes two ferromagnetic layers separated by a thin insulating layer. The insulating layer is thin enough to allow charge carriers to tunnel between the ferromagnetic layers. The resistance of the magnetic tunneling junction depends upon the orientation of the magnetic tunneling junctions.

FIG. 1 depicts a conventional magnetic memory cell 10 as used in a conventional magnetic memory. The conventional memory cell 10 is coupled with a voltage supply line 20 and receives a current Ir 18 during reading. The conventional memory cell 10 includes a magnetic tunneling junction 12 and a transistor 14. The magnetic tunneling junction 12 is represented by a resistor. The magnetic tunneling junction 12 is coupled to the drain of the transistor 14. The source of the transistor 14 is coupled to ground. The state of the magnetic tunneling junction 12, and thus the data stored by the conventional memory cell 10 is sensed by detecting the voltage at output 16. The output 16 is coupled to the magnetic tunneling junction 12 of the conventional memory cell 10.

FIG. 2 depicts a conventional memory array 30 using the conventional memory cell 10. The conventional array 30 is shown as including four conventional memory cells 10. The memory cells 10 are coupled to reading/writing column selection 32 via bit lines 34 and 36 and to row selection 50 via word lines 52 and 54. The bit lines are coupled to the magnetic tunneling junctions 12, while the word lines 52 and 54 are coupled to the gates of the transistors 14. Also depicted are digit lines 44 and 46 which carry current that applies a field to the appropriate conventional memory cells 10 during writing. The reading/writing column selection 32 is coupled to write current source 38 and read current source 40 which are coupled to a line 42 coupled to a supply voltage VDD 48. Also shown are current source Iw 38 and Ir 40 used in writing and reading, respectively, to the conventional memory cells 10. Also depicted are transistors 58 and 60 that are controlled using control line 62.

In order to write to the conventional memory cell 10, the write current Iw 38 is applied to the bit line 34 or 36 selected by the writing/reading column selection 32. The read current Ir 40 is not applied. Both word lines 52 and 54 are disabled. The transistors 14 in all memory cells are disabled. In addition, one of the digit lines 44 or 46 selected carries a current used to write to the selected conventional memory cell 10. The combination of the current in a digit line 44 or 46 and the current in a bit line 34 or 36 will write to the desired conventional memory cell 10. Depending upon the data written to the conventional memory cell 10, the magnetic tunneling junction will have a high resistance or a low resistance.

When reading from a conventional cell 10 in the conventional memory array 30, the write current Iw 38 is disabled and the transistors 58 and 60 are turned off by controlling the control signal through the control line 62. The read current Ir 40 is applied instead. The memory cell 10 selected to be read is determined by the row selection and column selection 32. The transistors 14 in the selected cell are on. The output voltage is read at the output line 56. For example, assuming that the resistance of the magnetic tunneling junction in a low (ferromagnetic layers polarized parallel) state is twenty kilo-ohms, that the magnetoresistance ratio is twenty percent, and that a read current used is ten microamps. In such a case, the output voltage would either be 240 mV or 200 mV. Thus, there is a forty millivolt difference in the signals output for different states of the conventional magnetic memory cell 10.

Although the conventional memory array 30 and the conventional memory cells 10 function, one of ordinary skill in the art will readily recognize that the difference in the signals output by the conventional memory cells 10 is relatively small. The difference in output signals between the two states of the conventional memory cell 10 is on the order of tens of millivolts. The output signals are typically on the order of a few hundred millivolts. As a result, the conventional memory cells 10 and the conventional memory array may be subject to errors.

Accordingly, what is needed is a system and method for providing a magnetic memory cell having an improved signal. The present invention addresses such a need.

SUMMARY OF THE INVENTION

The present invention provides a method and system for providing and using a magnetic memory. The method and system comprise providing at least one memory cell. In one embodiment, the at least one memory cell is arranged in an array of rows and columns. Each memory cell includes a magnetic tunneling junction and a transistor. The magnetic tunneling junction includes a first ferromagnetic layer, a second ferromagnetic layer and an insulating layer between the first ferromagnetic layer and the second ferromagnetic layer. The transistor includes a source, a drain and a gate. The source of the transistor is coupled to the magnetic tunneling junction, while the drain of the transistor is coupled with an output for reading the magnetic memory cell. A row of memory cells is selected using a row line coupled with the gate of the transistors in the row. A constant voltage is preferably provided to the selected row. All transistors' gates in the selected row connect to the same voltage. At the same time, a column of memory cells is selected to read from using a column line coupled with the drains of the transistors in the column. In another aspect, a load is provided to the column of the array during reading. The current in the transistors, and thus the output voltage at the drain of the transistors, depends upon the state of the magnetic tunneling junction. The states of the magnetic tunneling junction can be read out by detecting the voltage at the output or by detecting the current in the load or at the drain of the transistor.

According to the system and method disclosed herein, the present invention provides a magnetic memory having a higher output signal.

DETAILED DESCRIPTION OF THE INVENTION

The present invention relates to an improvement in magnetic memories. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiment shown, but is to be accorded the widest scope consistent with the principles and features described herein.

A method and system for providing and using a magnetic memory is disclosed. The method and system include providing at least one memory cell. In one embodiment, the at least one memory cell is arranged in an array of rows and columns. Each memory cell includes a magnetic tunneling junction and a transistor. The magnetic tunneling junction includes a first ferromagnetic layer, a second ferromagnetic layer and an insulating layer between the first ferromagnetic layer and the second ferromagnetic layer. The transistor is preferably a metal-oxidation-semiconductor field effect transistor (MOSFET) including a source, a drain and a gate. However, other types of transistors, such as junction FET (JFET), bipolar transistors or other transistors could also be used. The source of the transistor is coupled to the magnetic tunneling junction, while the drain of the transistor being coupled with an output for reading the magnetic memory cell. A row of memory cells is selected using a row line coupled with the gate of the transistors in the row. A constant voltage is preferably provided to the selected row of the array during reading.

The present invention will be described in terms of a particular memory array having certain magnetic memory cells. However, one of ordinary skill in the art will readily recognize that this method and system will operate effectively for other memory arrays having other or additional components in the magnetic memory cells not inconsistent with the present invention.

Figure 3:
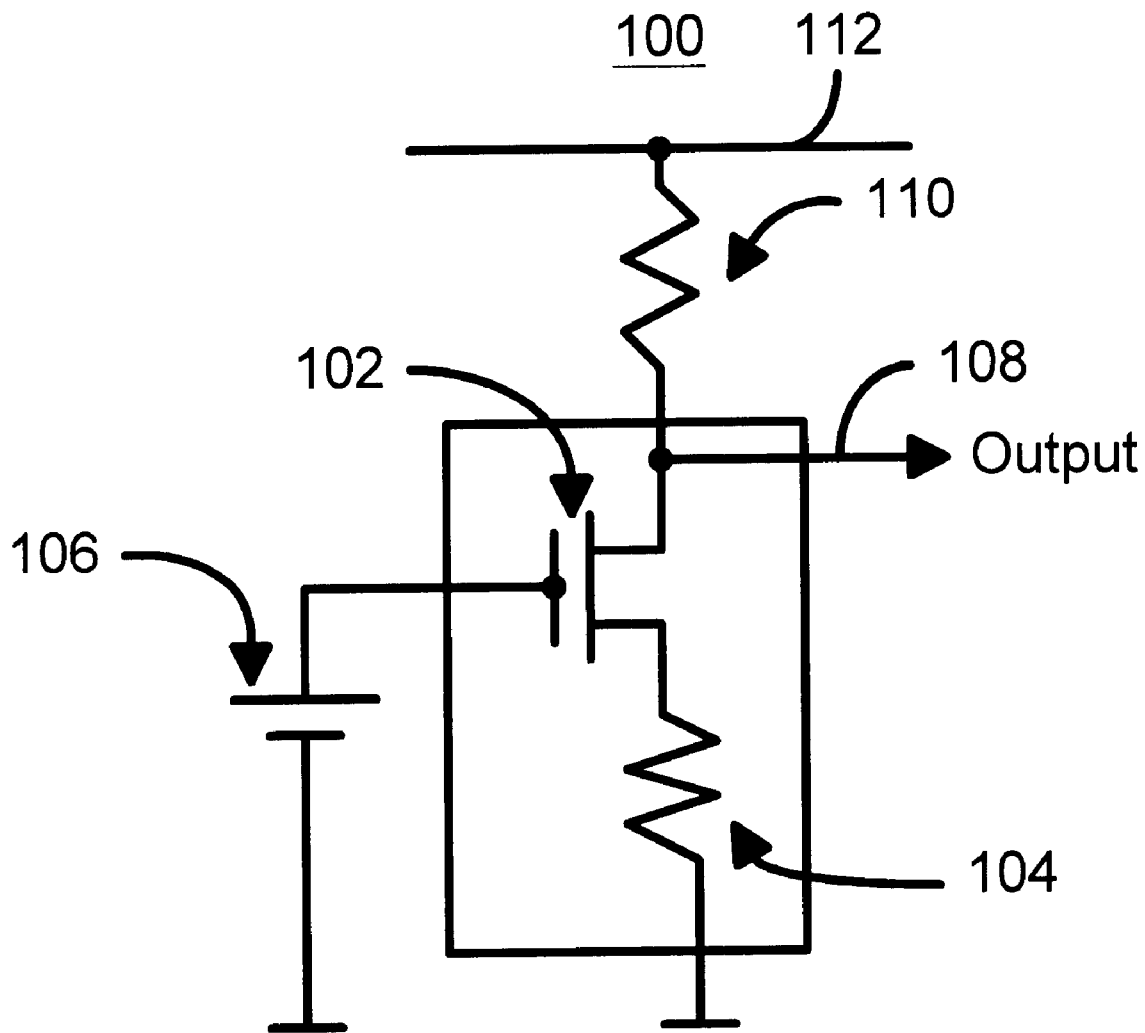
FIG. 3 is a diagram of one embodiment of a magnetic memory cell in accordance with the present invention.

To more particularly illustrate the method and system in accordance with the present invention, refer now to FIG. 3, depicting one embodiment of a magnetic memory cell 100 in accordance with the present invention. The memory cell 100 includes a transistor 102 and a magnetic tunneling junction 104. The magnetic tunneling junction 104 preferably includes two ferromagnetic layers separated by a thin insulating layer. The insulating layer is preferably thin enough to allow charge carriers to tunnel between the ferromagnetic layers. The transistor 102 is preferably a MOSFET and has a source, a drain and a gate. The magnetic tunneling junction 104 is coupled to the source of the transistor 102 and with ground. The drain of the transistor 102 is coupled with an output line 108. The output line 108 is used to read the memory cell 100. Also shown is the load 110 that is coupled between the memory cell 100 and the supply voltage 112. The load 110 may be a resistor, a transistor, or any type of device that can be used as an active load. During reading, the gate of the transistor 102 is coupled to the voltage source 106.

In operation, the resistance of the magnetic tunneling junction 104 changes depending on the state of the magnetic tunneling junction 104. Furthermore, the magnetic tunneling junction 104 acts as a negative feedback resistor in a common-source amplifier. Thus, the voltage of the memory cell 100 depends both upon the resistance of the magnetic tunneling junction and the voltage gain of the transistor 102. For example, suppose that G is the gain of the transistor 102. During reading, the output of the memory cell 100 is the voltage at the source of the transistor 102, which is developed by the magnetic tunneling junction 104, multiplied by G. Similarly, the states of the magnetic tunneling junction 104 can be read out by detecting the current in the load 110 or at the drain of the transistor 102.

Figure 1:
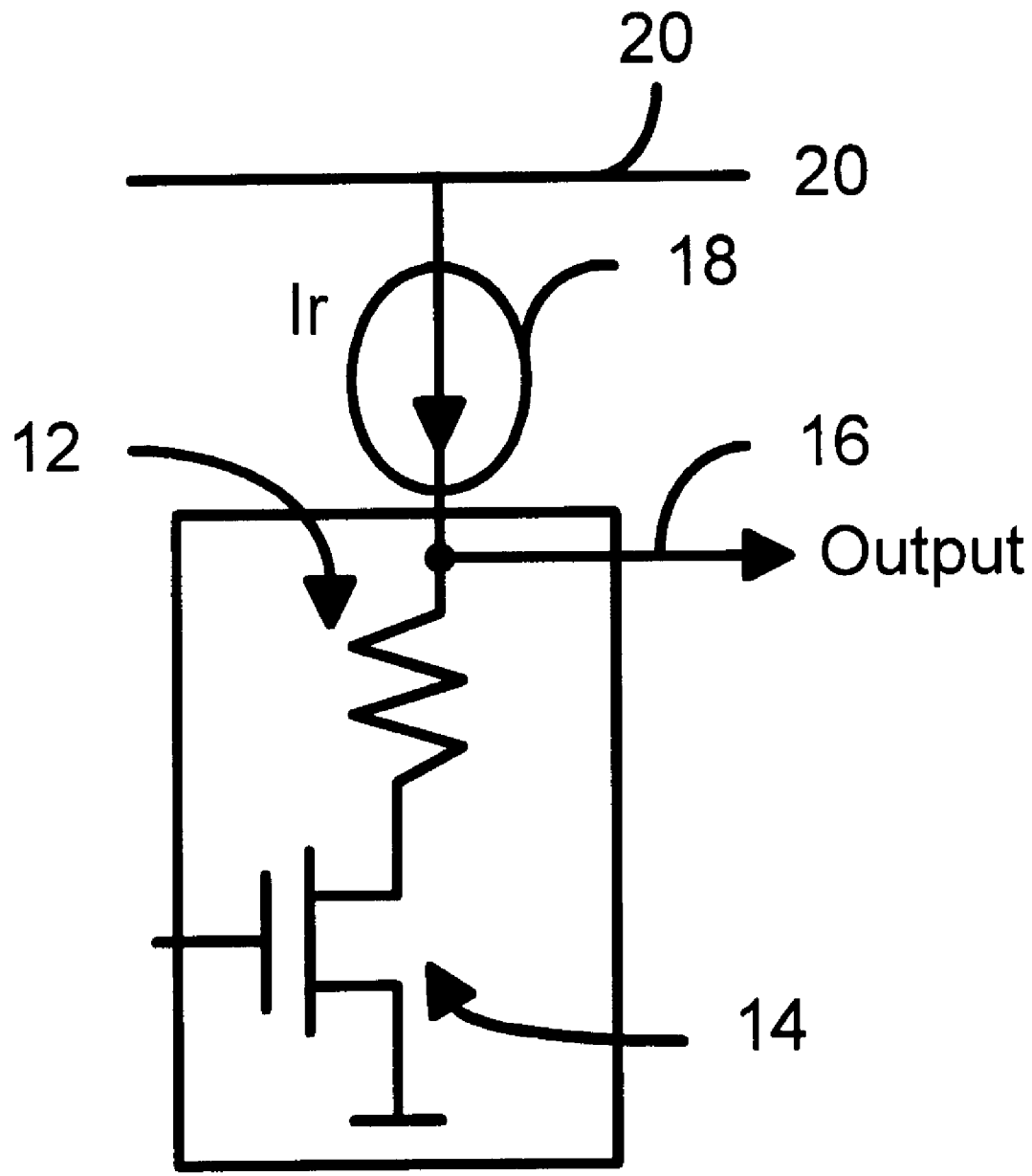
FIG. 1 is a diagram of a conventional magnetic memory cell.
Figure 2:
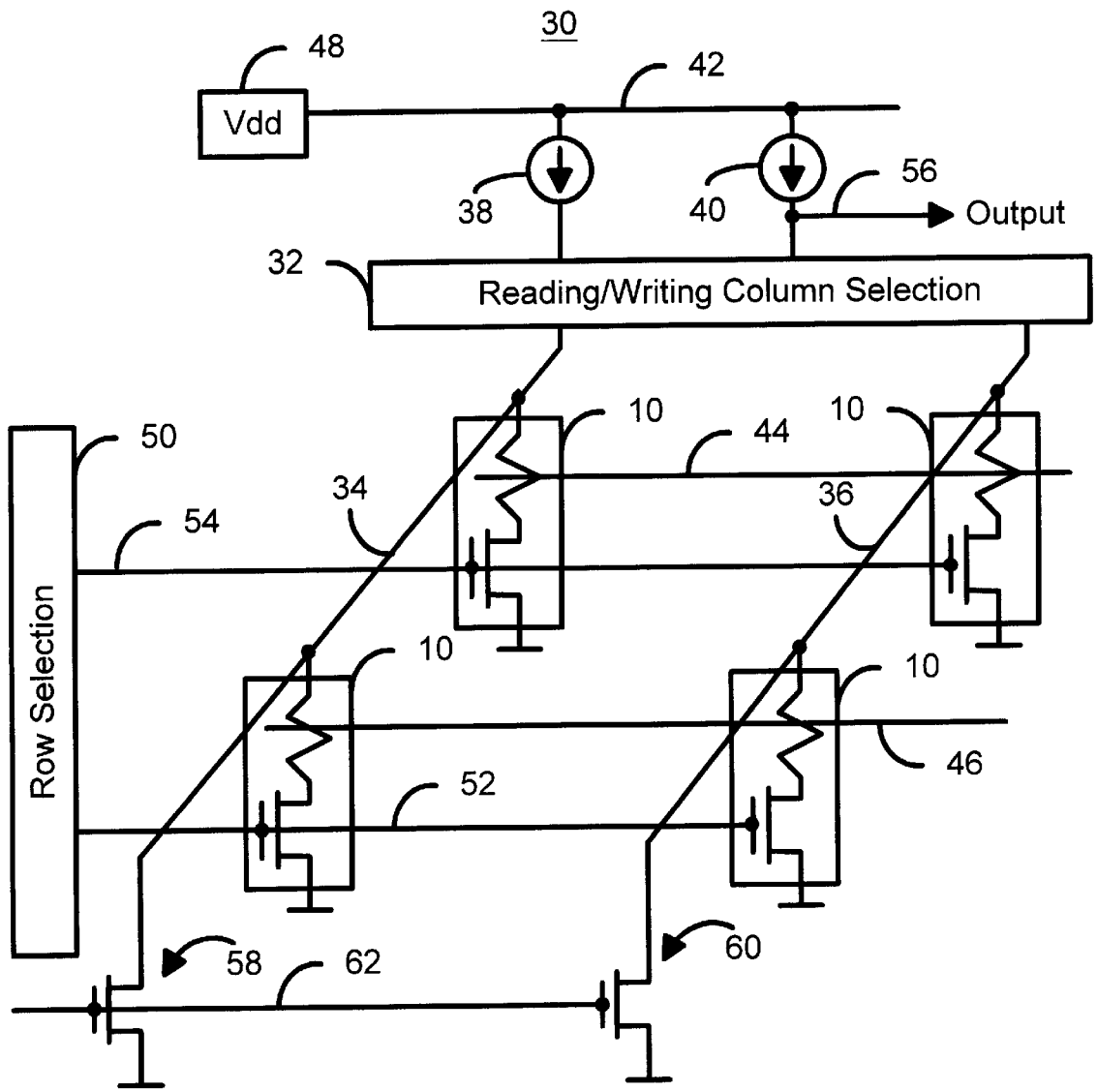
FIG. 2 is a diagram of a conventional memory array that utilizes the conventional magnetic memory cell.

Because the signal is output over output line 108, the difference in signal between the states of the magnetic tunneling junction 104 is large. For example, G is often on the order of tens. Thus, the output voltage signal is generally tens of times the voltage developed across the magnetic tunneling junction 104. For example, assume, as discussed above, that the resistance of the magnetic tunneling junction 104 is twenty kilo Ohms when in the low resistance state, that the magnetoresistance ratio of the magnetic tunneling junction 104 is twenty percent and that the current through the magnetic tunneling junction 104 is ten micro-amps during reading. Also assume that the load 110 is a resistor of two hundred and fifty kilo Ohms, that the threshold voltage of the transistor 102 is 0.8 volts, that the source-gate voltage of the transistor 102 is 1.02 volts and that the voltage applied to the gate of the transistor is 1.22 volts. The difference in output signal would then be on the order of three hundred and seventeen millivolts. This difference is significantly larger than the forty millivolt difference in the signals output for different states of the conventional magnetic memory cell 10 described in FIGS. 1 and 2. If a transistor is used as an active load for the load 110, the difference in the signals output between the two magnetic tunneling junction states of the memory cell 100 is even larger because of the transistor's high output resistance. Referring back to FIG. 3, the signal output by the memory cell 100 is thus relatively large. As a result, the data stored by the memory cell 100 can be much more easily and reliably read. Furthermore, other circuitry which may be needed to reliably read a memory having a smaller signal, such as reference cells, high-sensitivity differential amplifiers and comparators, may be omitted or simplified. As a result, the signal processing circuitry and an array constructed using the memory cells 100 may be simpler.

Figure 4:
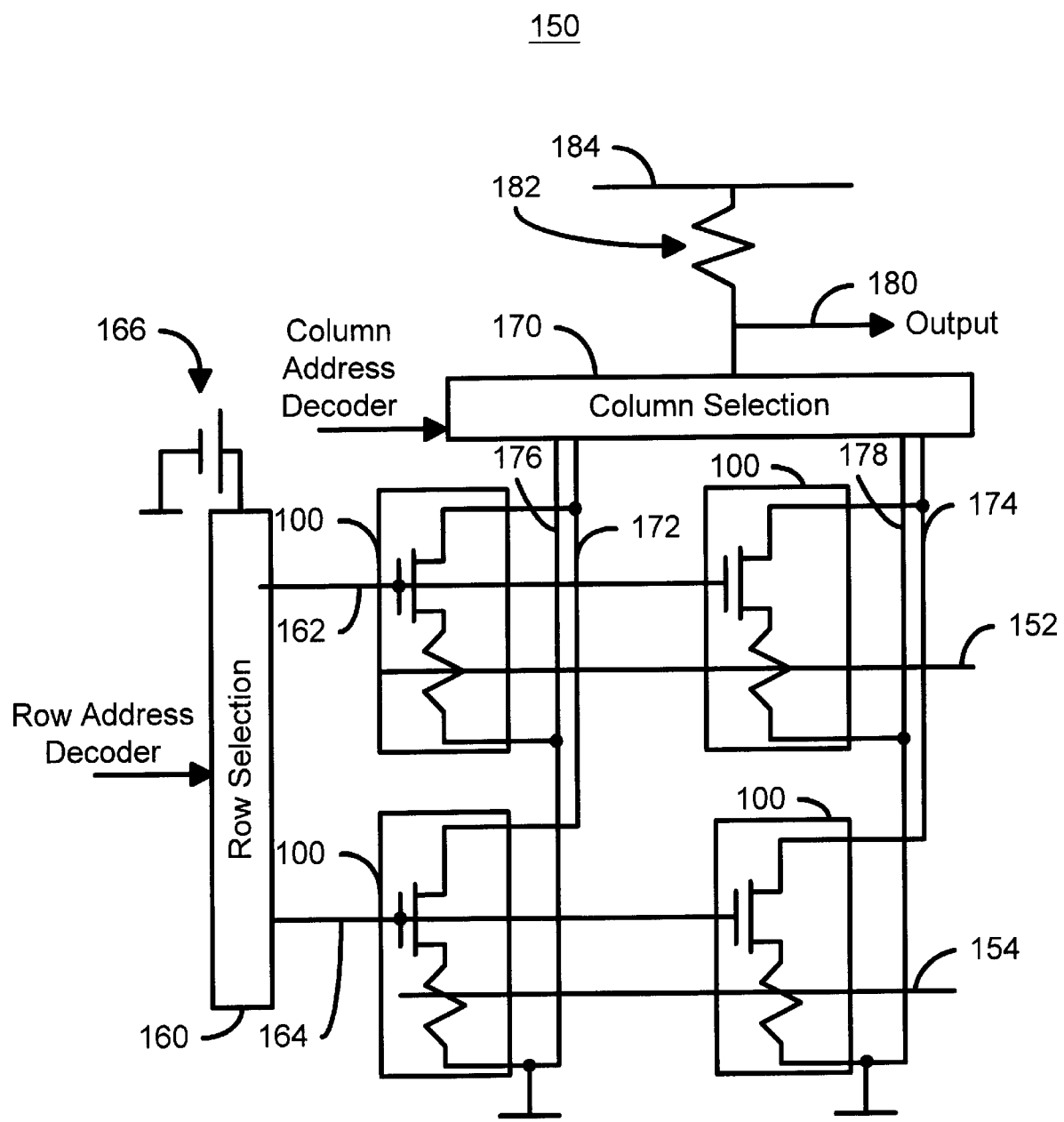
FIG. 4 is a diagram of one embodiment of a memory array using one embodiment of a magnetic memory cell in accordance with the present invention.

FIG. 4 is a diagram of one embodiment of a memory array 150 using one embodiment of the magnetic memory cell 100 in accordance with the present invention. The memory array 150 is depicted as having four memory cells 100. However, another number of memory cells is typically used. The memory array 150 includes a row selection 160 and a column selection 170. The row selection 160 is coupled to word lines 162 and 164 and to a voltage source 166 that is preferably a constant voltage source. The word lines 162 and 164 are coupled to the gates of the transistors in rows of the memory array. The memory array 150 also includes column selection 170 coupled with read bit lines 172 and 174 (used for reading). The column lines 172 and 174 are coupled to the drains of the transistors 104 in memory cells 100 in columns of the memory array 150. The column selection 170 is coupled to output line 180 as well as to the supply voltage line Vdd 184 via load 182. Also depicted are digit lines 152 and 154 and write bit lines 176 and 178. The magnetic tunneling junctions 104 are coupled to the transistor 102 at one end and to ground at the other end.

In operation, the row selection 160 selects a row for reading by providing a voltage to the gate of the transistor 102 of the selected memory cell 100 via the word line 162 or 164. The column selection 170 selects a read bit line 172 or 174 to read from. The output voltage is read on output line 180. An alternative output is the current in the load 180. Because of the arrangement of the transistor 102 and the magnetic tunneling junction 104 in the memory cell 100, the voltage developed on the output line 180 is relatively large. In particular, as discussed above, the transistor 102 amplifies the signal from the magnetic tunneling junction 104 for output over the output line 180.

During writing, all transistors in all memory cells are disabled. A write current by passes the magnetic tunneling junctions and flows through one of the selected write bit lines 176 or 178 to ground. The write bit lines 176 and 178 are used for writing and controlled by the column selection 170, or a similar component. Simultaneously, the digit line 152 or 154 carries current that flows through the digit line 152 or 154. This current flows substantially perpendicular to the flow of current in the write bit line 176 or 178. The cell residing in the selected row and column is written. Depending upon the direction of flow of the current in the digit line 152 or 154 (i.e. right to left or left to right as shown in FIG. 4), the state of the magnetic tunneling junction is set to be a low resistance or a high resistance. Thus, the array 150 utilizes the memory cells 100. In order to do so, the memory array 150 applies a voltage to the gates of the transistors 102 in the selected cell. Because the memory array 150 can utilize the memory cells 100, the memory array 150 can provide a larger difference in output signals for different states of the memory cells 100. Consequently, the memory array 150 is more reliable.

Figure 5:
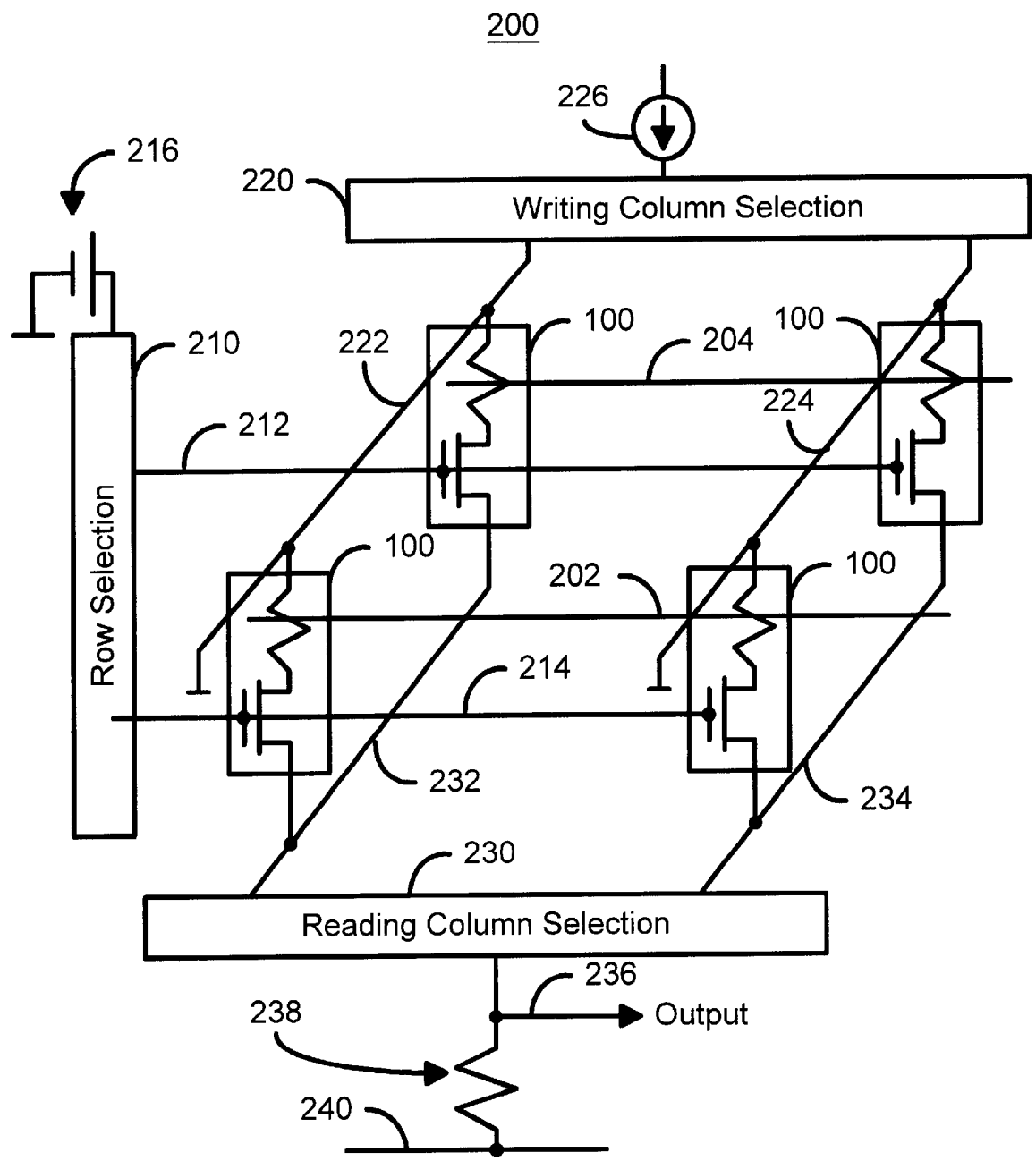
FIG. 5 is a diagram of a second embodiment of a memory array using one embodiment of a magnetic memory cell in accordance with the present invention depicting the read/write scheme and arrangement of components.

FIG. 5 depicts an embodiment of a memory array 200 using one embodiment of a magnetic memory cell 100 in accordance with the present invention that displays the reading/writing scheme and positioning. The memory array 200 includes a row selection 210, a writing column selection 220 and a reading column selection 230. Column selection can be split for reading and writing into two components, as indicated in FIG. 5, for convenience and/or ease of depiction. However, nothing prevents the reading and writing column selection from being performed by a single unit. Both writing column selection 220 and read column selection 230, if split, can be at the same sides, top or bottom of the memory array 200. The row selection 210 is coupled to the gates of the transistors 102 of the memory cells 100 via word lines 212 and 214. The reading column selection 230 is coupled to the drains of the transistors 102 via read bit lines 232 and 234. The reading column selection is coupled to an output 236 and a line 240 to a supply voltage Vdd via a load 238. The writing column selection 220 is coupled to the magnetic tunneling junctions 104 of the memory cells 100 via write bit lines 222 and 224. The writing column selection 220 receives write current Iw 226 during writing. Also depicted are digit lines 202 and 204, which provide a current for writing to the memory cells in a write mode.

During reading, the row selection 210 selects a row for reading by providing a voltage to the gate of the transistor 102 of the selected memory cell 100 via the word line 212 or 214. The writing column selection 220 is disabled during reading. Thus, the write current Iw will not be provided to the memory cells 100 during reading. The reading column selection 230 selects a column to read. The reading column selection 230 selects a column to read. The current through the transistor and the read bit line 232 or 234 depends upon the state of the magnetic tunneling junction 104 in the selected cell 100. The output voltage is read on output line 236. Similarly, the states of the magnetic tunneling junction can also be read out by detecting the electric current in the load 238. Because of the arrangement of the transistor 102 and the magnetic tunneling junction 104 in the memory cell 100, the voltage developed on the output line 236 is relatively large. In particular, as discussed above, the transistor 102 amplifies the signal from the magnetic tunneling junction 104 for output over the output line 236.

During writing, all transistors in all cells are disabled by the word line 212 or 214. The reading column selection 230 is disabled during writing. The writing column selection 220 provides a write current which flows through the selected write bit line 222 or 224 to ground. Simultaneously, the digit line 202 or 204 carries current flowing through the digit line 202 or 204. This current flows substantially perpendicular to the flow of current in the write bit line 222 or 224. The cell residing in the selected write bit line 222 or 224 and the selected digit line 202 or 204 is written. Depending upon the direction of flow of the current in the digit line 202 or 204 (i.e. right to left or left to right as shown in FIG. 5), the state of the magnetic tunneling junction is set to be a low resistance or a high resistance. Thus, the array 200 utilizes the memory cells 100. In order to do so, the memory array 200 applies a voltage to the gates of the transistors 102 in the selected cell 100. When read, the current in the transistor 102 and read bit line 232 or 234 depends on the state of the magnetic tunneling junction 104. Similarly, the output voltage output at line 236 also depends upon the state of the magnetic tunneling junction 104. Because the memory array 200 can utilize the memory cells 100, the memory array 200 can provide a larger signal, that is, a larger difference between output signals for different states of the memory cells 100. Consequently, the memory array 200 is more reliable.

Consequently, the memory cell 100 and memory arrays 150 and 200 have a larger signal and are more reliable. At the same time, the memory arrays 150 and 200 may have simpler circuitry. In addition, the write current can pass through the write bit line to ground without requiring the transistors, such as the transistors 58 and 60 of the conventional memory array in FIG. 2, to provide a bypass for write current.

A method and system has been disclosed for a magnetic memory cell, a magnetic memory array and a method for utilizing the memory cell and array. Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A magnetic memory cell comprising:
    a magnetic tunneling junction including a first ferromagnetic layer, a second ferromagnetic layer and an insulating layer between the first ferromagnetic layer and the second ferromagnetic layer; and
a transistor having a source, a drain and a gate, the source of the transistor being coupled to an end the magnetic tunneling junction, the drain of the transistor being coupled with an output for reading the magnetic memory cell;
the magnetic tunneling junction being configured to be written to a plurality of times.

2. The magnetic memory cell of claim 1 wherein the transistor is a MOSFET or another type of transistor.

3. The magnetic memory cell of claim 1 wherein a second end of the magnetic tunneling junction is coupled to ground.

4. A magnetic memory comprising:
a plurality of memory cells arranged in an array including a plurality of rows and a plurality of columns, each of the plurality of memory cells including a magnetic tunneling junction and a transistor having a source, a drain and a gate, the source of the transistor being coupled to the magnetic tunneling junction, the drain of the transistor being coupled with an output for reading the magnetic memory cell, the magnetic tunneling junction being configured to be written to a plurality of times;
a plurality of row lines coupled to the plurality of rows, the plurality of row lines coupled to gate of the transistor in each of the plurality of memory cells in the plurality of rows;
a row selector coupled to the plurality of row lines for selecting between the plurality of row lines and providing a constant voltage to a selected row of the plurality of rows.

5. The magnetic memory of claim 4 wherein the at least one column selector further includes:
a reading column selector coupled with the plurality of columns for selecting a portion of the plurality of memory cells during reading; and
a writing column selector coupled with the plurality of columns for selecting a portion of the plurality of memory cells during writing.

6. The magnetic memory of claim 4 further comprising:
a plurality of digit lines for providing a current for writing to a portion of the plurality of memory cells.

7. The magnetic memory of claim 5 further comprising:
a plurality of reading column lines, the plurality of reading column lines being coupled with the reading column selector and the drain of the transistor in each of the plurality of memory cells.

8. The magnetic memory of claim 7 wherein the reading column selector provides a load to a portion of the reading column lines during reading.

9. The magnetic memory of claim 5 further comprising:
a plurality of writing column lines, each of the plurality of lines having a first end and a second end, the plurality of writing column lines being coupled with the writing column selector at the first end, the second end being coupled to a ground, a column of the plurality of columns residing between the first end and the second end.

10. The magnetic memory of claim 9 wherein the writing column selector provides a constant current to a portion of the writing column lines during writing.

11. A method for utilizing a magnetic memory comprising the steps of:
(a) in a write mode, writing to a first portion of a plurality of memory cells, the plurality of memory cells arranged in an array including a plurality of rows and a plurality of columns, each of the plurality of memory cells including a magnetic tunneling junction and a transistor having a source, a drain and a gate, the source of the transistor being coupled to the magnetic tunneling junction, the drain of the transistor being coupled with an output for reading the magnetic memory cell, the write mode capable of writing to the first portion of the plurality of memory cells a plurality of times;
(b) in a read mode, reading from a second portion of the plurality of memory cells.

12. The method of claim 11 wherein the reading step (b) further includes the steps of:
(b1) selecting the second portion of the plurality of memory cells using a plurality of row lines coupled to the plurality of rows, the plurality of row lines coupled to gate of the transistor in each of the plurality of memory cells in the plurality or rows, the second portion of the plurality of memory cells being selected by providing a constant voltage to a portion of the plurality of row lines coupled to the second portion of the plurality of memory cells.

13. The method of claim 11 wherein the reading step (b) further includes the steps of:
(b2) selecting the second portion of the plurality of memory cells using a plurality of column lines coupled to the plurality of columns, the plurality of column lines providing a load to the second portion of the plurality of memory cells.

14. The method of claim 11 wherein the reading step (b) further includes the step of:
(b) reading data from the output coupled with the drain of the transistor of each memory cell of the second portion of the plurality of memory cells.

15. The method of claim 11 wherein the writing step (a) further includes the steps of:
(a1) selecting the first portion of the plurality of memory cells using a portion of a plurality of digit lines, the portion of the plurality of digit lines providing a write current.

16. The method of claim 11 wherein the writing step (a) further includes the step of:
(a2) selecting the first portion of the plurality of memory cells using a plurality of column lines coupled to the plurality of columns, the plurality of column lines providing bit line write current during writing to the first portion of the plurality of memory cells.

* * * * *